(12) United States Patent
Lee et al.

(10) Patent No.: US 7,135,727 B2
(45) Date of Patent: Nov. 14, 2006

(54) I-SHAPED AND L-SHAPED CONTACT STRUCTURES AND THEIR FABRICATION METHODS

(75) Inventors: Ming Hsiu Lee, Hsinchu (TW); Ruichen Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/985,480

(22) Filed: Nov. 10, 2004

(65) Prior Publication Data

US 2006/0099795 A1    May 11, 2006

(51) Int. Cl.
*H01L 27/108*    (2006.01)
(52) U.S. Cl. .............................. 257/296; 257/E31.029; 257/300; 257/614
(58) Field of Classification Search ............... 257/296, 257/300, E31.029
See application file for complete search history.

(56) References Cited

U.S. PATENT DOCUMENTS

| | | | |
|---|---|---|---|
| 5,281,549 A * | 1/1994 | Fazan et al. ................ 438/254 |
| 6,031,287 A | 2/2000 | Harshfield | |
| 6,093,604 A * | 7/2000 | Jeong .......................... 438/257 |
| 6,111,264 A | 8/2000 | Wolstenholme et al. | |
| 6,114,713 A | 9/2000 | Zahorik | |
| 6,127,224 A * | 10/2000 | Pio ............................. 438/258 |
| 6,189,582 B1 | 2/2001 | Reinberg et al. | |
| 6,307,229 B1 * | 10/2001 | Zatelli et al. ................ 257/321 |
| 6,437,393 B1 * | 8/2002 | Pio ............................. 257/314 |
| 6,514,788 B1 | 2/2003 | Quinn | |
| 6,597,009 B1 | 7/2003 | Wicker | |
| 6,744,088 B1 * | 6/2004 | Dennison ..................... 257/296 |
| 6,847,535 B1 * | 1/2005 | Gilton et al. .................. 365/51 |

* cited by examiner

*Primary Examiner*—Thao P. Le
(74) *Attorney, Agent, or Firm*—Stout, Uxa, Boyan & Mullins, LLP

(57) ABSTRACT

Contact structures having I shapes and L shapes, and methods of fabricating I-shaped and L-shaped contact structures, are employed in semiconductor devices and, in certain instances, phase-change nonvolatile memory devices. The I-shaped and L-shaped contact structures produced by these methods exhibit relatively small active areas. The methods that determine the contact structure dimensions employ conventional semiconductor deposit and etch processing steps that are capable of creating readily reproducible results.

18 Claims, 17 Drawing Sheets

I-SHAPED AND L-SHAPED CONTACT STRUCTURES AND THEIR FABRICATION METHODS

BACKGROUND OF THE INVENTION

1. Field of the Invention

This invention relates generally to semiconductor devices and fabrication methods and, more particularly, to methods for fabricating contacts for use in phase change memory devices.

2. Description of Related Art

Solid-state memory devices are used throughout the field of electronics. Typical memory applications include dynamic random access memory (DRAM), static random access memory (SRAM), read only memory (ROM), erasable programmable read only memory (EPROM), electrically erasable programmable read only memory (EEPROM), and flash memory. These can be divided into volatile and non-volatile memories. The primary element of the non-volatile devices, such as an EEPROM, typically employs a floating gate field effect transistor. A charge is stored on the gate of the field effect transistor to program each memory bit and has limited reprogrammability. These classes of memories may also be relatively slow to program. Although the memory cells of SRAMs, ROMs, EPROMs, EEPROMs, and flash memories do not require refreshing, they may suffer from disadvantages such as lower storage densities, larger size, and greater cost to manufacture compared to volatile DRAM devices.

The prior art has endeavored to create memory devices that are both random access and non-volatile using phase changing memory elements, as opposed to the charge storage memory elements used in many commercial memory devices. The term memory material will be used herein to refer to a material exhibiting structure phase changes in response to external stimuli. An example of a memory material is a phase-change material such as chalcogenide. The use of phase change memory materials that can be electrically switched between a generally amorphous first structural state and a generally crystalline second structural state for electronic memory applications is thus known in the art. Phase change materials may also be electrically switched between different detectable states of local order across an entire spectrum between the completely amorphous and the completely crystalline states. These materials are also truly non-volatile in that, when set in either a crystalline, semi-crystalline, amorphous, or semi-amorphous state, they possess a fixed resistance value. That resistance value is retained until reset as it represents a physical state of the material (e.g., crystalline or amorphous).

The large dynamic range of resistance values offered by phase change memory materials theoretically provides for the storage of multiple bits of binary information in a single cell. This could possibly be achieved by encoding binary information in analog form and, thereby, storing multiple bits of binary encoded information as multiple resistance values in a single cell. Thus, phase change memories may be able to be operated as traditional binary memories or as memories with numerical bases greater than two.

Typical materials suitable for phase change memory material applications include those utilizing various chalcogenide-including materials. Typical chalcogenide-including materials used for phase change memory applications may contain, for example, at least one of Te, Se, Ge, Sb, Bi, Pb, Sn, As, S, Si, P, and/or O. These non-volatile memory devices may use for example a monolithic body of chalcogenide material. A resulting memory structure, at least in theory, may require very little chip real estate to store a bit of information, thereby providing for inherently high-density memory chips.

One characteristic common among solid state memory devices including phase change memory devices is significant power consumption, particularly in setting or resetting memory elements. Even as downscaling of component sizes continues, power consumption continues to be a significant consideration, particularly in portable devices that rely on power cells (e.g., batteries). The reduction in power consumption of a memory device continues to be a priority.

The operation of chalcogenide memory cells requires that a region of the chalcogenide memory material, referred to as the active region, be subjected to a current pulse to set or reset the value retained by the cell. The switching voltages, currents, and powers of chalcogenide memory elements are believed to be scalable with device size and contact area, so that smaller contacts may produce smaller active regions with correspondingly lower power consumptions. With conventional semiconductor processing technology, the minimum achievable dimensions of a contact for a chalcogenide memory device may be limited by photolithography tools. Such dimensions may cause switching currents, voltages, and switching times to be too large and cycle life to be too small for integration with many leading-edge semiconductor technologies. Additionally, conventional chalcogenide memory fabrication methods may not be able to efficiently and reliably produce the uniform memory elements needed for large-scale memory devices.

A need thus exists in the prior art to provide memory contacts having a reduced size and a method for reliably manufacturing the contacts for phase-change memory devices so that, among other benefits, power requirements to program the memory devices may be reduced.

SUMMARY OF THE INVENTION

The present invention addresses these needs by providing I-shaped and L-shaped contact structures having relatively small cross-sectional areas or contact regions at interfaces between the contact structures and conductors. These I-shaped and L-shaped contact structures may comprise conductive materials or memory materials.

The present invention has, for example, further application is semiconductor devices generally as it affords a means of fabricating ultra-small contacts thereby permitting further reduction in the sizes of semiconductor devices. Additionally, with fabrication methods of the present invention, each contact region is on only one side of the support structure (defined below), enabling better design rules and a wider process window, with no wasted structure. In illustrated embodiments, the memory material may comprise a phase-change material such as chalcogenide.

The method of the present invention employs deposition and etch processes known in the art of semiconductor processing which may be readily applied to produce relatively uniform results. The methods may also result in top electrodes that are self-aligned to the contact structures, forming self-aligned I-shaped or L-shaped contact structure arrays. This characteristic may additionally permit photo process windows to be enlarged. Additionally, the pitch of the support structure is twice that of the bit line, resulting in a pitch that is not very small, thus facilitating relative ease in control of the support structure etch process.

In one embodiment of the invention, an I-shaped contact structure and a method of forming an I-shaped contact structure are provided in which the contact structure is formed on the side of a support structure disposed on a substrate. The contact structure may be formed from a conducting material or a memory material. The cross section of the contact structure is a narrow rectangular shape similar to a letter "I" or a "1" as will be illustrated in the detailed description.

In another embodiment of the invention, an L-shaped contact structure and a method of forming an L-shaped contact structure are provided in which the contact structure is similarly formed on the side of a support structure disposed on a substrate. The contact structure may be formed from a conducting material or a memory material. The cross section of the contact structure is a narrow rectangular shape with a foot portion similar to the letter "L" as will be illustrated in the detailed description.

Another embodiment of the invention comprises a memory element including a bottom conducting element disposed on a substrate. This embodiment further comprises an I-shaped or L-shaped contact structure at least partially disposed over the bottom conducting element such that the I-shaped or L-shaped contact structure is operatively coupled with the bottom conducting element. The embodiment further comprises a memory material, such as a phase-change material, at least partially disposed over the I-shaped or L-shaped contact structure, the memory material being operatively coupled with the I-shaped or L-shaped contact structure. A top conducting element is operatively coupled with the memory material. The memory element may additionally include a diode or a transistor as an access device.

An exemplary embodiment of the invention comprises an array of memory elements formed at least partially in a substrate and organized into rows and columns with memory elements at intersections of rows and columns. Each of a plurality of the memory elements comprises an access device coupling the memory element to a bottom conducting element defining one of the rows.

While the apparatus and methods have or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages, and novel features of the present invention are described herein. Of course, it is to be understood that not necessarily all such aspects, advantages, or features will be embodied in any particular embodiment of the present invention. Additional advantages and aspects of the present invention are apparent in the following detailed description and claims that follow.

DETAILED DESCRIPTION OF THE PRESENTLY PREFERRED EMBODIMENTS

Figure 1:
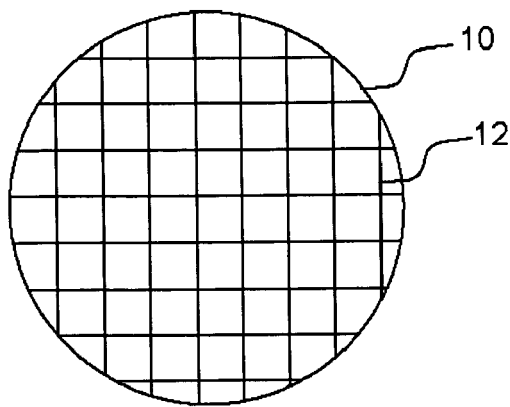
FIG. 1 is a top plan view of a wafer having a plurality of dies thereon.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of memory material cells. The present invention may be practiced in conjunction with various integrated circuit fabrication techniques that are conventionally used in the art, and only so much of the commonly practiced process steps are included as are necessary to provide an understanding of the present invention. The present invention has applicability in the field of semiconductor devices and processes in general. For illustrative purposes, however, the following description pertains to a memory material, such as a phase-change memory material, memory cell and to a method of fabricating an I-shaped or L-shaped contact structure having a small active area.

Figure 2:
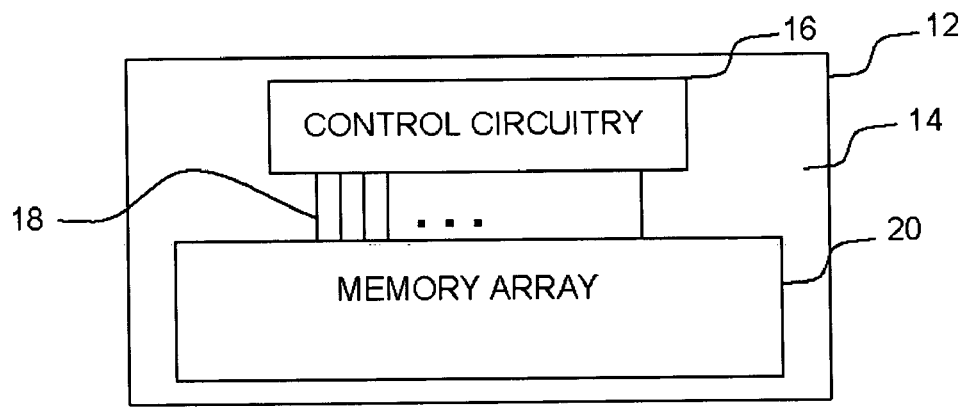
FIG. 2 is a block diagram of a substrate containing a memory device on a portion of a die.
Figure 3:
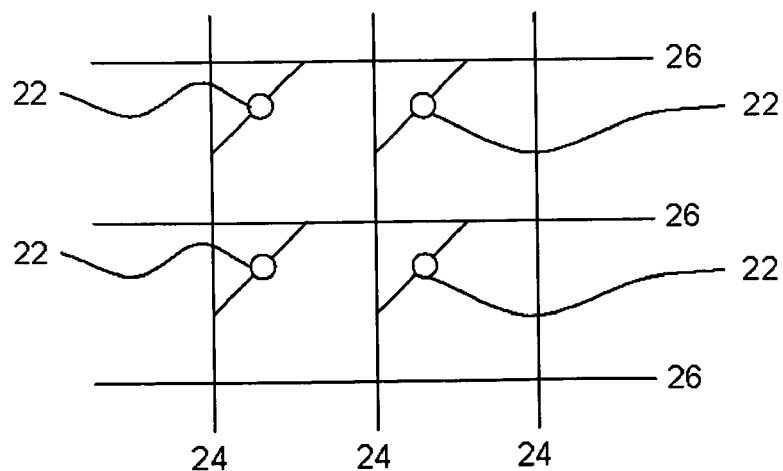
FIG. 3 is a schematic diagram of an exemplary embodiment of a portion of a memory array formed of memory cells fabricated according to a method of the present invention.
Figure 4A:
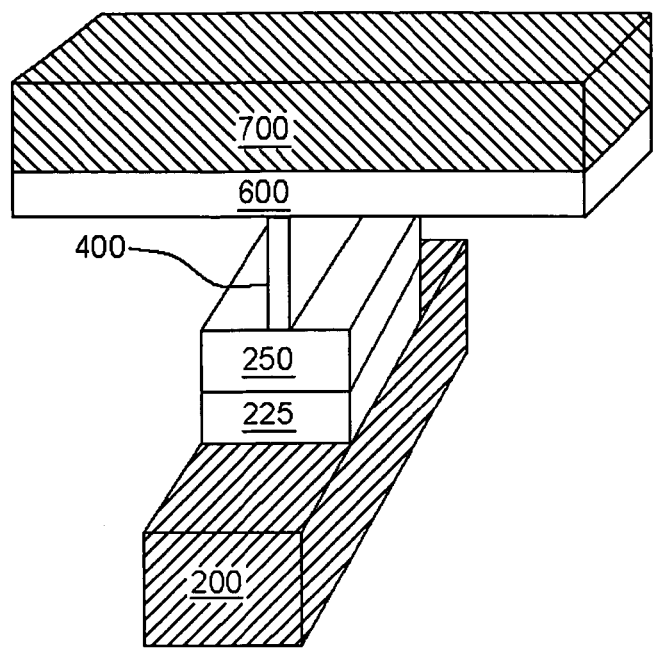
FIG. 4a is a perspective diagram that illustrates an overview of an embodiment of an I-shaped contact structure memory cell produced by an implementation of the present invention.
Figure 4B:
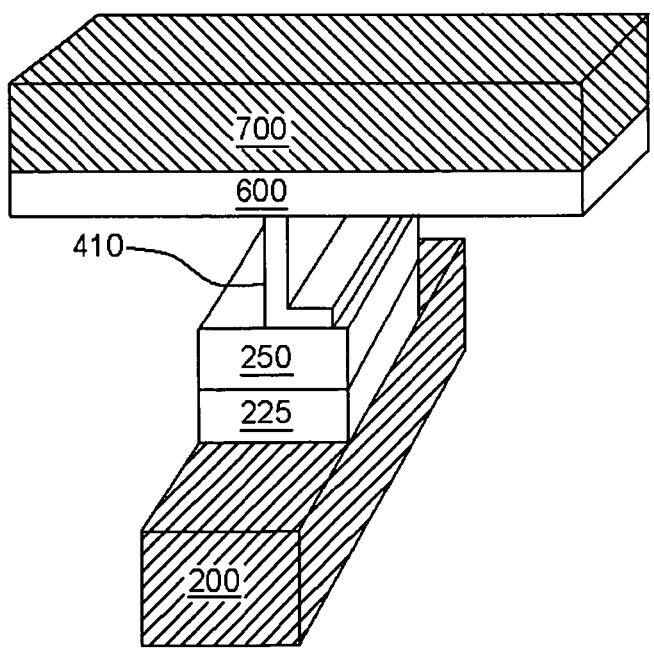
FIG. 4b is a perspective diagram illustrating an embodiment of an L-shaped contact structure memory cell produced by an implementation of the present invention.
Figure 5:
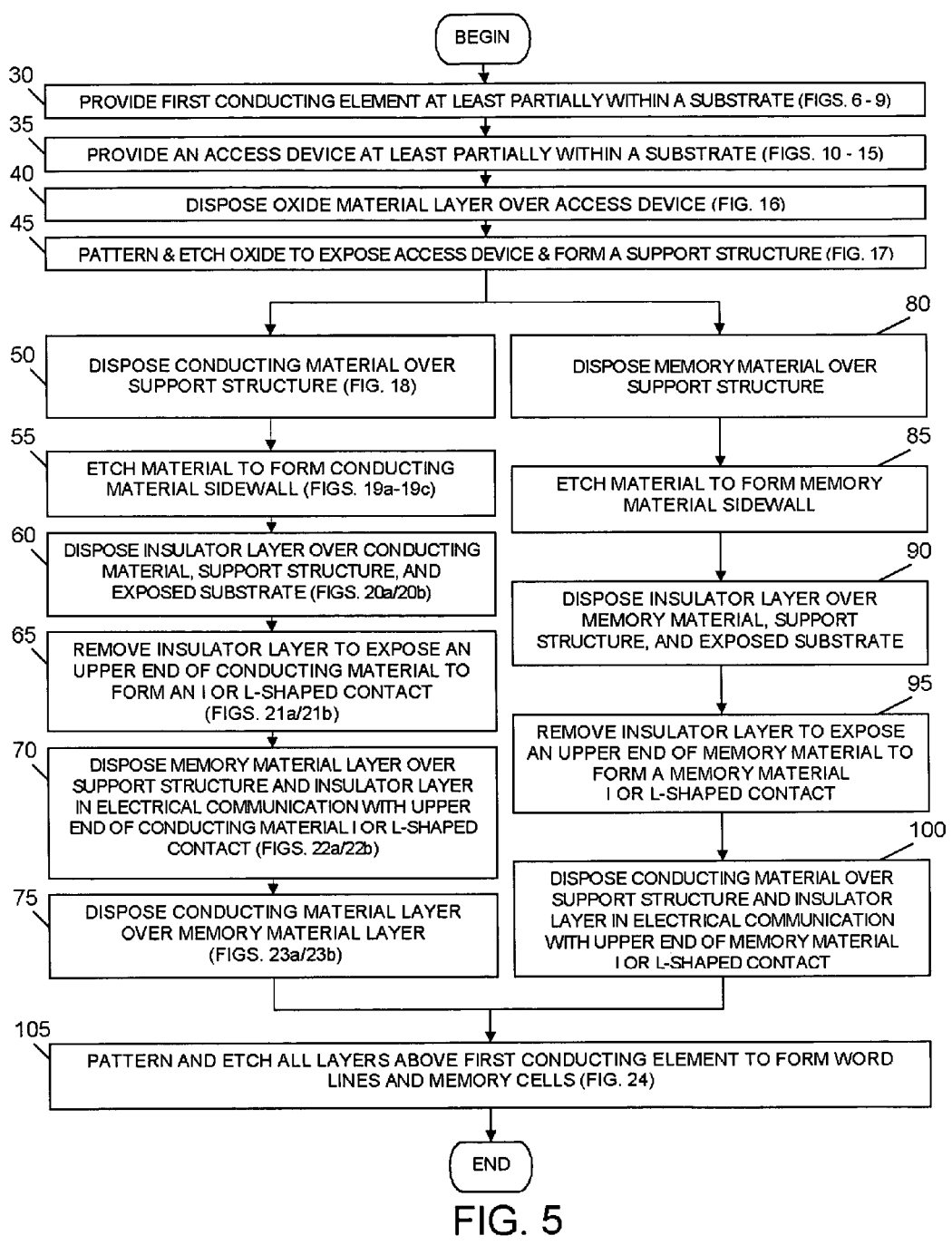
FIG. 5 is a flow diagram describing methods for forming memory cells according to the present invention.

Referring more particularly to the drawings, FIGS. 1–3 schematically present the context of the invention. FIGS. 4a and 4b are perspective views of exemplary memory cell embodiments according to the present invention. FIG. 5 is a flow diagram describing the inventive steps for forming memory cells employing I-shaped and L-shaped contact structures made of either a conducting material or a memory material. Diagrams of these steps are portrayed in FIGS. 7–25b wherein transistors are employed as the access devices.

With reference to FIG. 1, a wafer, such as a semiconductor wafer, is illustrated in plan view and generally designated by reference numeral 10. One or more integrated circuits may be fabricated on the wafer 10. Wafer 10 may be separated into a plurality of integrated circuit dies 12, which may subsequently be packaged as integrated circuit chips. FIG. 2 is a block diagram of a substrate containing a memory device on a portion of a die 12 that may contain an integrated circuit memory. The memory 14 may include one or more memory arrays 20. The illustrated memory array 20 is coupled to control circuitry 16 by lines 18. The control circuitry 16 accesses the memory array 20 for reading or writing by selecting the appropriate row and column coordinates depicted in FIG. 3.

FIG. 3 is a schematic diagram of an exemplary embodiment of a portion of a memory array 20 of FIG. 2 formed of memory cells fabricated according to a method of the present invention. The memory array 20 typically includes a plurality of memory cells 22 that are arranged in generally perpendicular rows and columns. The memory cells 22 in each column typically share an electrical connection referred to as a bit line 24, and the memory cells 22 in each row typically share an electrical connection referred to as a word line 26. In a typical implementation, each bit line 24 is formed of a bottom conducting element and each word line 26 is formed of a top conducting element. The control circuitry 16 of FIG. 2 accesses each memory cell 22 for reading or writing by selecting the appropriate row and column coordinates to activate a corresponding access device in a manner that is known in the art. The access devices may comprise, for example, transistors or diodes.

FIG. 5 is a flow diagram describing implementations of methods for forming a portion of a memory cell array according to the present invention. The implementations portray I-shaped or L-shaped contact structures made of either a conducting or memory material and employ diodes as access devices.

Step 30 begins with the provision of a bottom conducting element which can be constructed for subsequent operation as a bit line. An embodiment of a memory cell, produced by an implementation of the method of FIG. 5, is shown in FIG. 4a, wherein the bottom conducting element 200 takes the form of a bit line. Process steps leading to the formation of bottom conducting element 200 (step 30) are illustrated in FIGS. 6–9.

At step 35 an access device is provided, wherein in the illustrated embodiment a first layer of doped silicon material 225 and a second layer of doped silicon material 250 in combination form a diode access device, the formation of which is shown in FIGS. 10–15.

An I-shaped contact structure 400, which may comprise a conducting material, may be formed at steps 40–65, corresponding to FIGS. 16, 17, 18, 19a, 20a and 21a. Following formation of the I-shaped contact structure 400, a memory material and a top conducting element, also referred to as a word line, are formed at steps 70–75. For instance, as will be discussed in detail below, following deposition at step 50 of a conducting material (e.g., thin film) over a support structure and following steps 55–65, a memory material or phase-change memory material 600, such as chalcogenide, is formed at step 70 as detailed in FIG. 22a. Next, a top conducting element 700 is deposited as set forth at step 75 and elucidated in FIG. 23a. As an alternative to formation of the I-shaped contact structure 400 of a conducting material, steps 80–100 present formation of an I-shaped contact structure comprising a memory material, which embodiment is not specifically illustrated in the figures.

Figure 24:
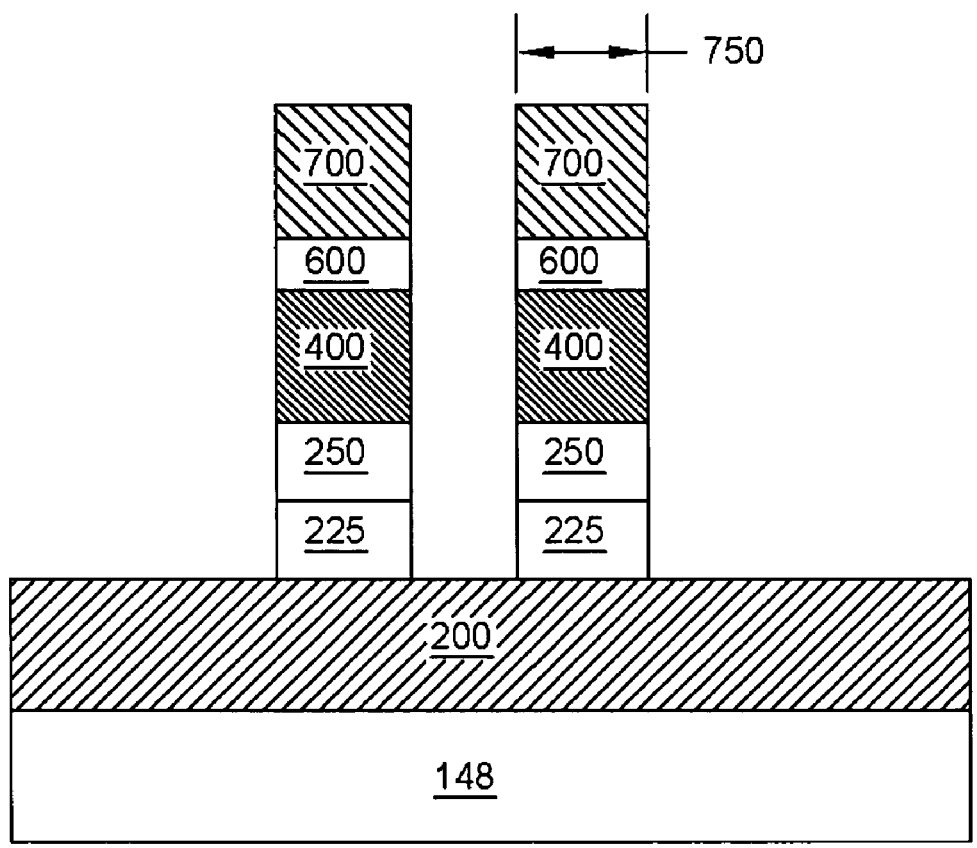
FIG. 24 shows the structures of FIG. 23a or 23b from a perspective perpendicularly oriented relative to the respective views of FIGS. 23a and 23b, after performance of an etch step.

At step 105 an etching step, which is depicted in FIG. 24, patterns and etches all exposed layers above the bottom conducting element 200 to form word lines and memory cells.

FIG. 4b is a perspective diagram similar to FIG. 4a, except that it presents an L-shaped contact structure 410 instead of an I-shaped contact structure 400. This figure thus represents another embodiment of a memory cell produced by an implementation of the method of FIG. 5, wherein initially a bottom conducting element 200 is formed (step 30) in the stages of FIGS. 6–9 mentioned above. Also, as with the embodiment of FIG. 4a, a first layer of doped silicon material 225 and a second layer of doped silicon material 250 are constructed to form a diode access device (step 35) as presented in the stages shown in FIGS. 10–15. An L-shaped contact structure 410, comprising for example a conducting material, is formed (steps 40–65) in stages shown in FIGS. 16, 17, 18, 19b, 19c, 20b, and 21b. A memory material or phase-change memory material 600, such as chalcogenide, is formed (step 70) in FIG. 22b, and a top conducting element 700 is deposited (step 75) in FIG. 23b. Alternatively, as with the I-shaped contact structure, the L-shaped contact structure may be formed of a memory material or phase-change material (steps 80–100) rather than a conducting material. Lastly, an etching process (step 105) shown in FIG. 24 patterns and etches all layers above the bottom conducting element 200 to form word lines and memory cells.

Figure 6:
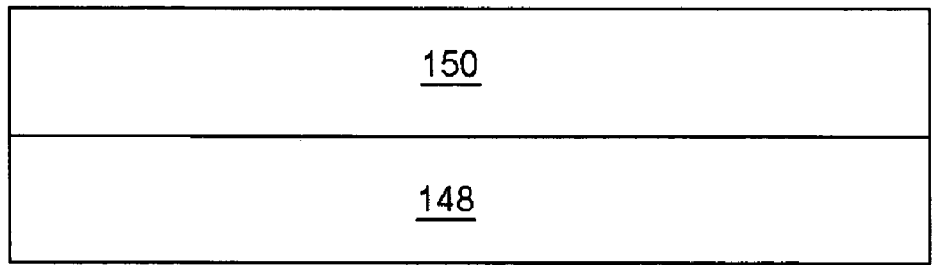
FIG. 6 is a cross-sectional view of a portion of a semiconductor substrate illustrating the result of early steps of an implementation of a method for forming a memory cell employing an I-shaped or L-shaped contact structure.
Figure 7:
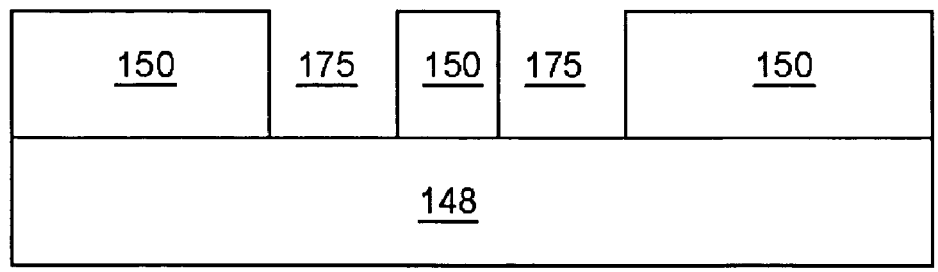
FIG. 7 shows the structure of FIG. 6 after removing portions of the oxide layer in accordance with one embodiment of the invention.
Figure 8:
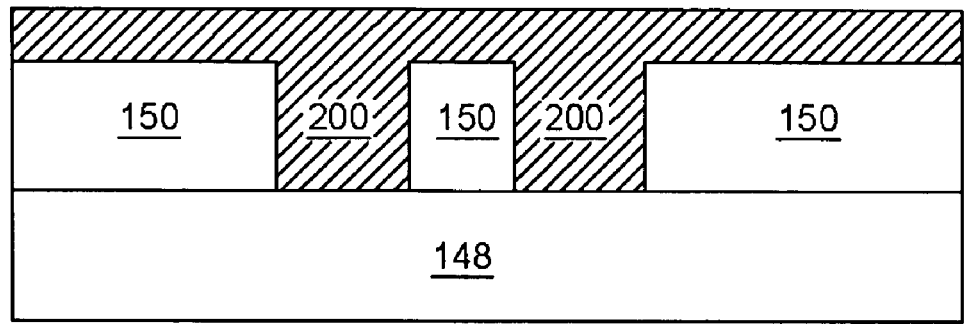
FIG. 8 shows the structure of FIG. 7 after formation of a first layer of conducting material in accordance with one embodiment of the invention.

With emphasis on FIGS. 6–15, the formation of a bottom conducting element and a diode access device is described. In particular, FIG. 6 is a cross-sectional view of a semiconductor substrate 148 having a first oxide layer 150 (e.g., silicon dioxide) deposited thereon, and FIG. 7 shows the structure of FIG. 6 following selective removal of portions of the first oxide layer 150 using known photolithographic processing to form trenches 175. FIG. 8 depicts the structure of FIG. 7 after formation using known techniques of a first layer of conducting material to provide for a bottom conducting element 200 disposed within the first oxide layer 150 (step 30). The conducting material may comprise, for example, Si, PL-Si, W, Cu, AlCu, or AlCiSu, combinations of these materials, or the like.

Figure 9:
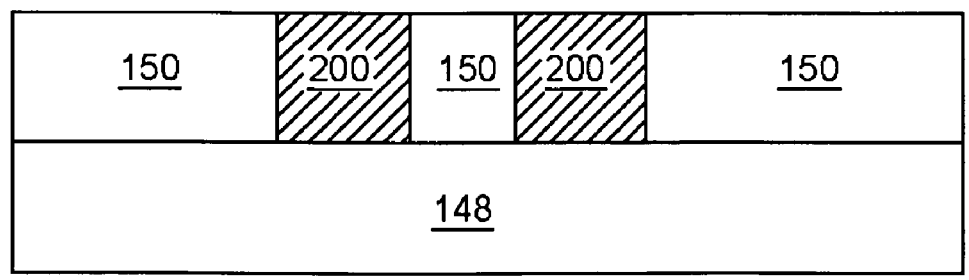
FIG. 9 shows the structure of FIG. 8 following removal of portions of the bottom conducting layer in accordance with one embodiment of the invention.

FIG. 9 shows the structure of FIG. 8, following removal of portions of the first layer of conducting material by an etch back or chemical mechanical polishing (CMP) process to expose upper surfaces of the first oxide layer 150 (step 30). This produces bottom conducting elements 200 that may serve as a bit lines of a memory array.

Figure 10:
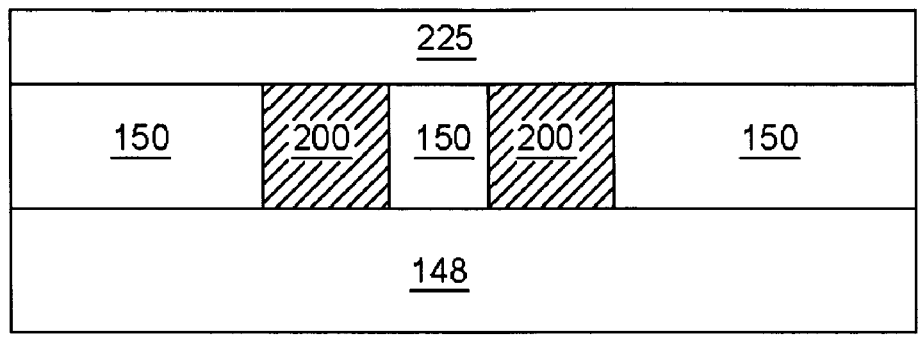
FIG. 10 shows the structure of FIG. 9 following formation of a first layer of doped silicon material to form a portion of a diode access device in accordance with one embodiment of the invention.
Figure 11:
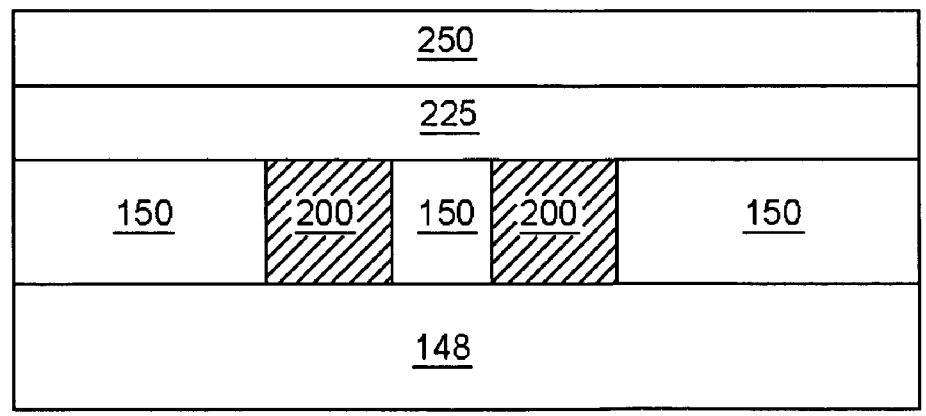
FIG. 11 shows the structure of FIG. 10 subsequent to formation of a second layer of doped silicon material to form a portion of a diode access device in accordance with one embodiment of the invention.

With reference to FIG. 10, a first layer of doped silicon material 225 is formed over the bottom conducting elements 200 (step 35). In FIG. 11 a second layer of doped silicon material 250 is formed over the first layer of doped silicon material 225 (step 35). According to an illustrated embodiment, the first layer of doped silicon material 225 comprises N-doped silicon implanted with, for example, about $10^{15}$–$10^{17}$ of dopant atoms per cubic centimeter. Further, in the illustrated embodiment, the second layer of doped silicon material 250 comprises P+ doped silicon implanted with, for example, about $10^{18}$–$10^{20}$ dopant atoms per cubic centimeter.

Figure 12:
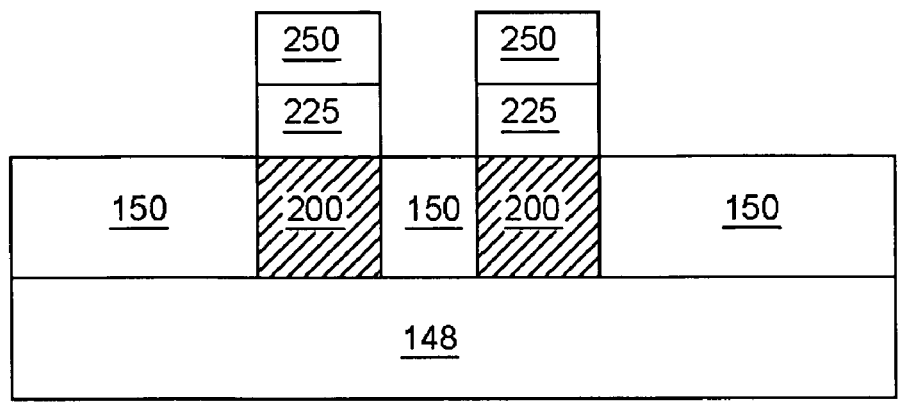
FIG. 12 shows the structure of FIG. 11 after etching to form access device diodes in accordance with one embodiment of the invention.

Referring to FIG. 12, the structure of FIG. 11 is shown following etching through the second 250 and first 225 layers of doped silicon material to form access device diodes in operative contact with the bottom conducting elements 200 (step 35). In a modified embodiment, N/P/metal (225, 250, 200) structures may be generated instead of the above P/N/metal (250, 225, 200) structures. The impurity concentrations of the P or N doped silicon can be varied to achieve high rectification ratios and high current densities, as well to provide good contact resistance at both ends. Although a diode is shown, it is to be appreciated that other isolation structures may be suitable in modified embodiments. Such devices may include, but are not limited to, metal oxide silicon (MOS) devices.

Figure 13:
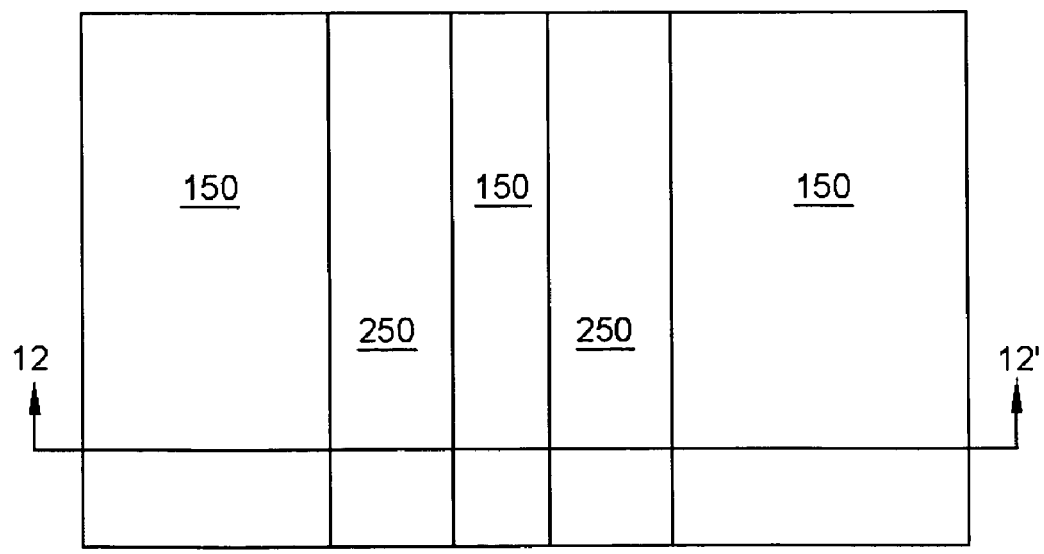
FIG. 13 shows a plan view of the structure of FIG. 12.
Figure 14:
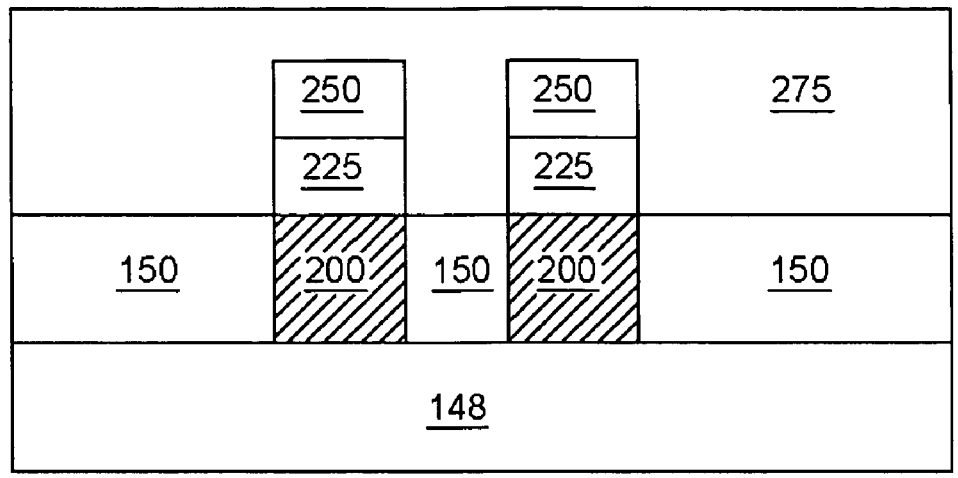
FIG. 14 shows the structure of FIG. 13 after formation of a layer of oxide material in accordance with one embodiment of the invention.
Figure 15:
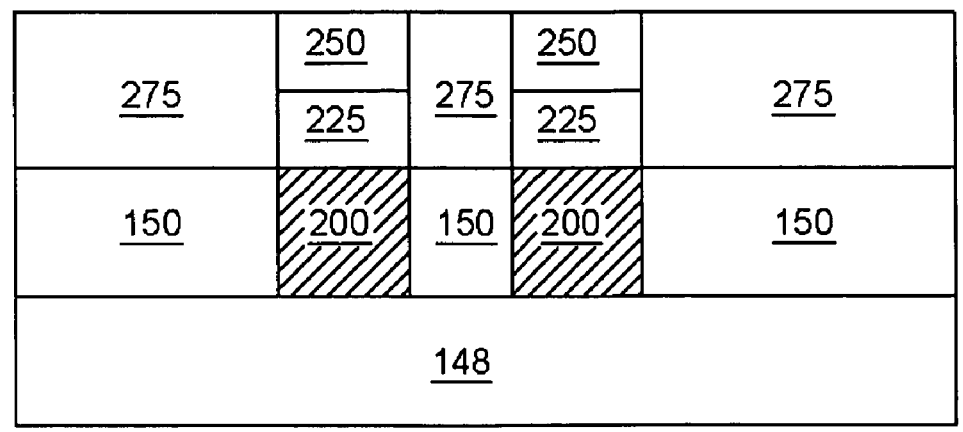
FIG. 15 shows the structure of FIG. 14 after chemical-mechanical-polishing (CMP) in accordance with one embodiment of the invention.

FIG. 13 shows the structure of FIG. 12 from a top view, wherein the orientation for the cross-sectional view of FIG. 12 is taken through the line 12–12' of FIG. 13. In FIG. 14 a layer of a second oxide material 275 is then formed over etched first 225 and second 250 doped silicon material layers (step 35). According to an illustrated embodiment, the second oxide material 275 comprises silicon dioxide ($SiO_2$) which is formed by a CVD process. A CMP or etch back process can subsequently be applied to the structure of FIG. 14 to remove the second oxide material layer 275 down to the second layer of doped silicon material 250 (step 35), thereby generating the structure of FIG. 15.

Figure 16:
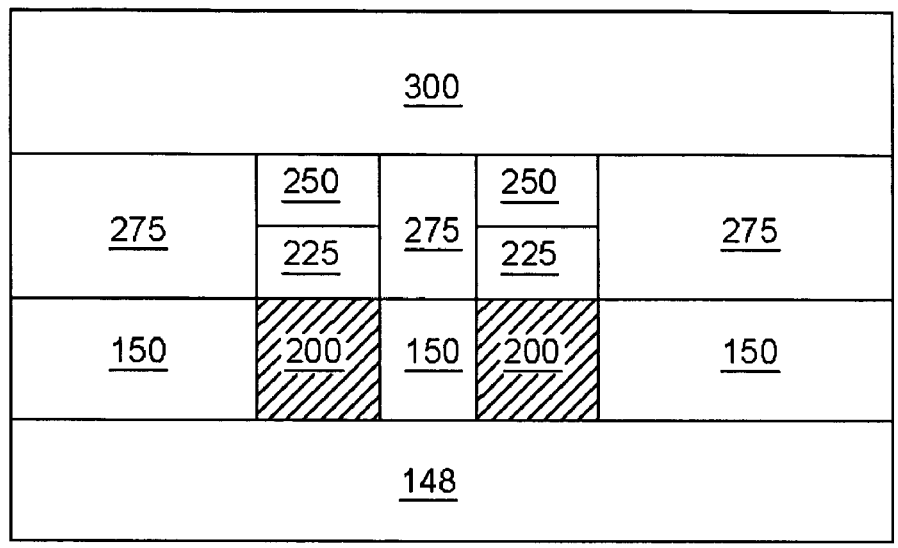
FIG. 16 shows the structure of FIG. 15 after formation of a layer of oxide material in accordance with one embodiment of the invention.

Turning to FIG. 16, a layer of pad material 300 is then formed over both the second layer of doped silicon material 250 and the first oxide layer 225 (step 40). The pad material 300 may comprise, for example, silicon dioxide, silicon nitride or some other oxide or non-oxide material. According to an illustrated embodiment, the pad material 300 may comprise $SiO_2$ which is formed by a CVD process.

Figure 17:
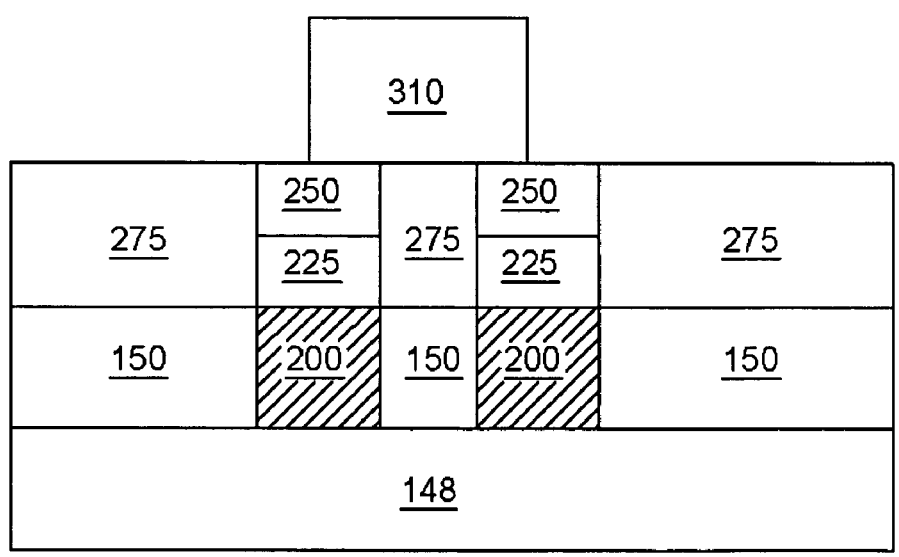
FIG. 17 shows the structure of FIG. 16 after formation of a support structure via an etch step in accordance with one embodiment of the invention.

FIG. 17 shows the structure of FIG. 16 after patterning of the pad material 300 by a photolithography and etch step (step 45). The pad material 300 is thus formed into a support structure 310 for subsequent formation of I-shaped or L-shaped contact structures. The support structure 310 comprises sidewalls which extend operatively over top surfaces of the second layer of doped silicon material 250.

Figure 18:
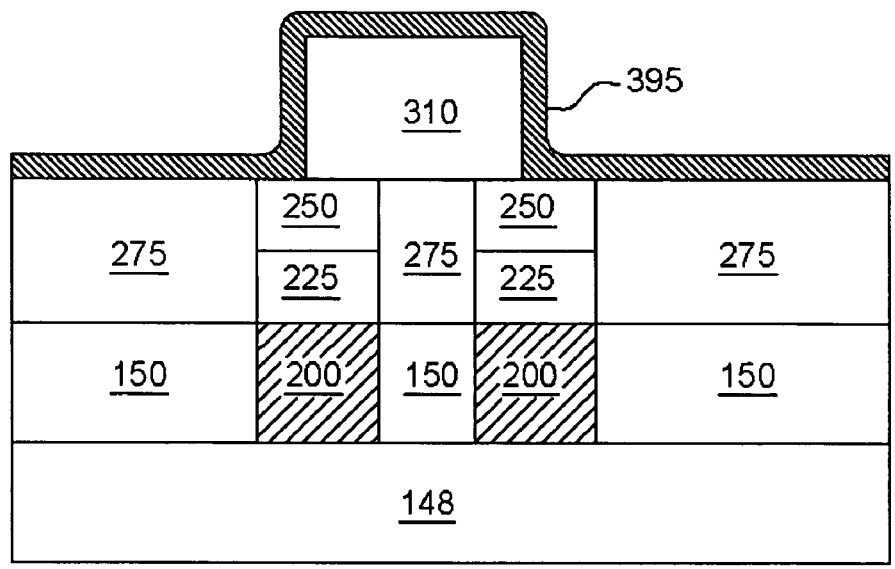
FIG. 18 shows the structure of FIG. 17 following formation of a conducting or memory material layer on the support structure in accordance with the present invention.

FIG. 18 depicts the structure of FIG. 17 following formation of a thin film layer 395 over the support structure 310 in accordance with an embodiment of the invention (step 50, cf. step 80). The sidewall of the support structure 310 is employed directly for shaping of the I-shaped or L-shaped contact structure; therefore, no spacer is required as a mask for the contact structure. This approach may also produce improved current density control such as, for example, current density being reduced at the feet of L-shaped contact structures. The thin film layer 395 may comprise either a conducting material (step 50) or a thin film memory material or phase-change material (cf. step 80).

Figure 19A:
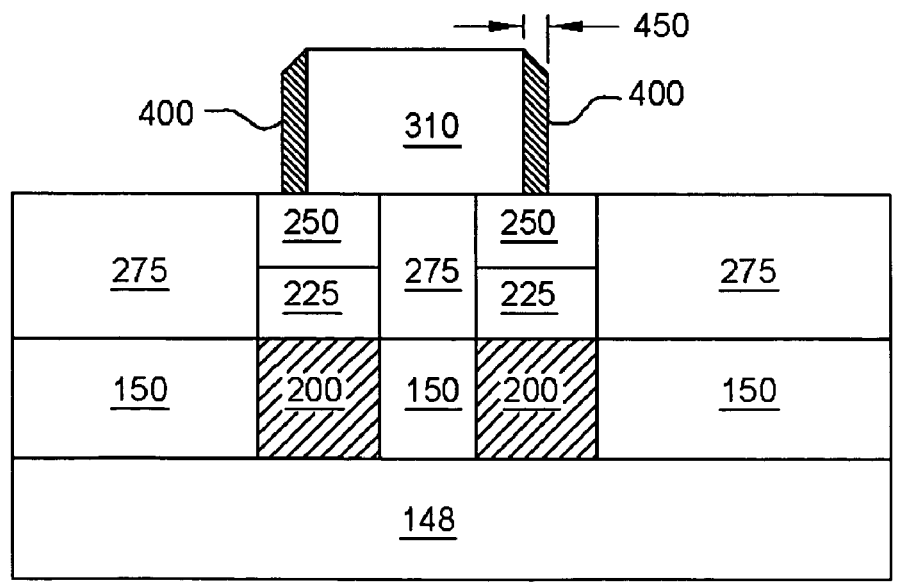
FIG. 19a shows the structure of FIG. 18 following an anisotropic etch step to form an I-shaped contact structure.

The thin film layer 395 is then etched (step 55, cf. step 85) to yield the structure of FIG. 19*a*. Removing portions of the thin film layer 395 forms conducting sidewalls or I-shaped contact structures 400 on the support structure 310 with a thickness 450. The etch process that removes portions of the thin film layer 395 may comprise an anisotropic etch process in which the etchant has a higher selectivity for the thin film layer 395 than for the second oxide material 275, the support structure 310, and the second doped silicon material 250. In the embodiment of FIG. 19*a*, the dimension 450 of the contact structure is at least partially controlled by the thickness of the thin film layer 395. According to an illustrative embodiment, the thin film layer 395 is deposited using a sputtering or chemical vapor deposition (CVD) process. Use of such exemplary processes may permit the thickness 450 of the thin film layer 395 to be precisely controlled by for example deposition time.

Figure 19B:
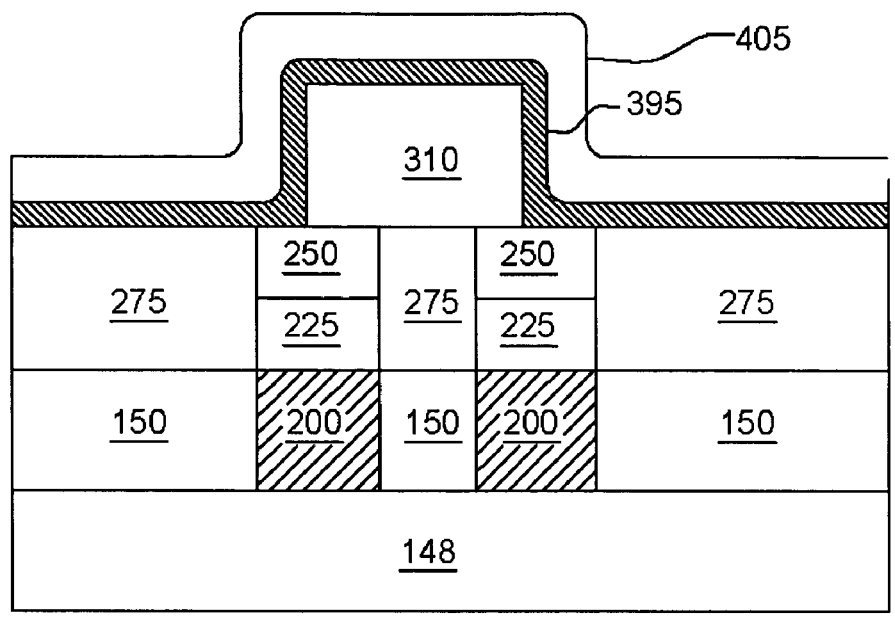
FIG. 19b shows the structure of FIG. 18 following formation of an oxide layer on the conducting or memory material layer in accordance with one embodiment of the invention.

FIG. 19*b* shows the structure of FIG. 18, through the same cross-sectional view, after an oxide layer 405 has been formed over the thin film layer 395 in accordance with an embodiment wherein conducting sidewall or L-shaped contact structures are to be formed. The oxide layer may comprise, for example, silicon dioxide formed using a tetraethylorthosilicate (TEOS) deposition process. In accordance with an illustrated embodiment, the oxide layer 405 is applied uniformly over substantially all of the exposed surfaces of the structure.

Figure 19C:
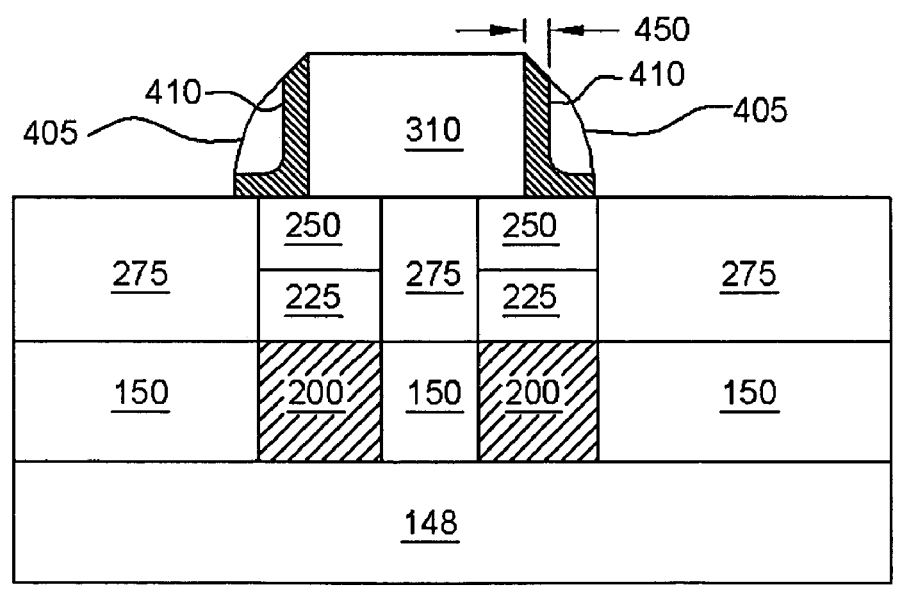
FIG. 19c shows the structure of FIG. 19b after an anisotropic etch step to form an L-shaped contact structure.

FIG. 19*c* shows the structure of FIG. 19*b* following formation of oxide spacers and L-shaped contact structures 410 via an etch sequence comprising one or more anisotropic etches. An anisotropic etch can be directed in a vertical direction to remove horizontal portions of the oxide layer 405 (FIG. 19*b*) while leaving residual oxide spacers that cover vertical portions and parts of lower horizontal portions of the thin film layer 395. For example, an anisotropic etch may be performed in which the etchant has a higher selectivity for the oxide layer 405 than for the thin film layer 395. The characteristics of pressure and power, for example, can be varied in the anisotropic etching process to accelerate ions vertically as opposed to at angles. Following the etch, the residual oxide spacers have rounded or curved shapes which will serve to define the L-shaped contact structures in an ensuing etch that removes exposed portions of the thin film layer 395. For example, a following anisotropic etch may be performed in which the etchant has a higher selectivity for the thin film layer 395 than for the oxide spacers, the support structure 310 and the second oxide layer 275, to thereby form L-shaped contact structures 410. Alternatively, the etch sequence performed on the structure of FIG. 19*b* can include a single anisotropic etch that removes portions of the oxide layer 405 and thin film layer 395, wherein the etchant has a higher selectivity for the oxide layer 405 and the thin film layer 395 than for the support structure 310 and the second oxide layer 275. The length of the foot portion of each L-shaped contact structure may be controlled, for example, by controlling the thickness of the oxide layer 405 and/or the degree of anisotropy or other characteristics of the etch sequence.

In typical embodiments of both the I-shaped and L-shaped contact structures, which may be referenced as blade contacts, the sidewall thickness 450 can be from about 0.1 nanometers to about 1000 nanometers and in an exemplary embodiment can be about 100 nanometers. The thin film layer 395 (FIG. 8) may comprise a conducting material, such as Ti, W, TiN, TiW, $Ti_xSi_y$, or $Ti_xAl_yN_z$, combinations of these materials, or the like.

In modified embodiments wherein I-shaped or L-shaped contact structures are formed of memory materials, similar process flows can comprise disposition of memory material over the support structure followed by etching of the memory material using processes similar to those set forth above to form memory material sidewalls defining I-shaped or L-shaped contact structures. A memory material of typical embodiments may comprise, for example, germanium, antimony, and tellurium (e.g. Ge2Sb2Te5) formed over the support structure 310 using a sputtering process to thicknesses (cf. 450) ranging from about 0.1 nanometers (nm) to about 1000 nanometers and in an illustrated embodiment of about 200 nanometers.

Figure 25A:
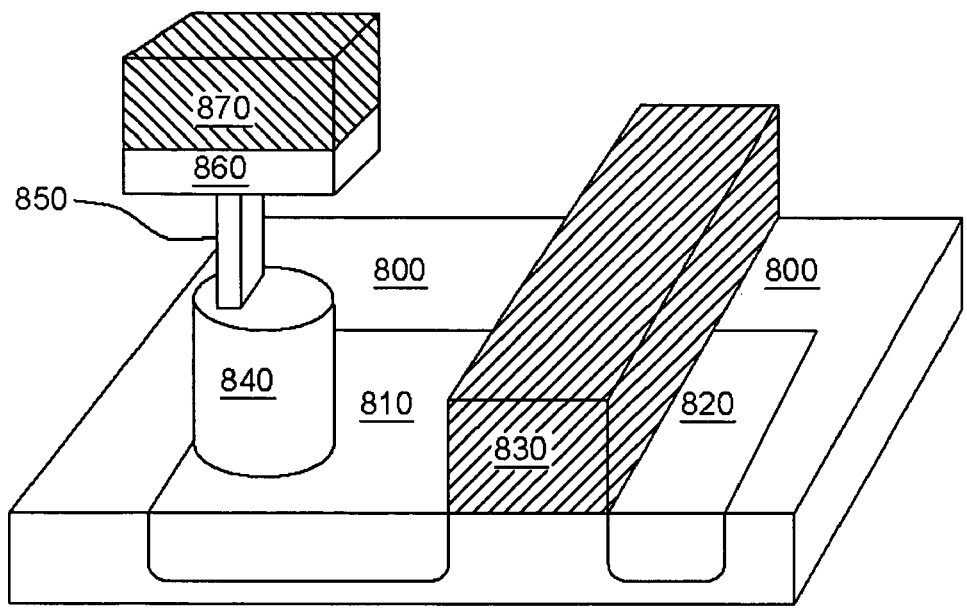
FIG. 25a is a perspective diagram illustrating an overview of an embodiment of a conductive I-shaped contact structure memory cell produced by an implementation of the method of the present invention.
Figure 25B:
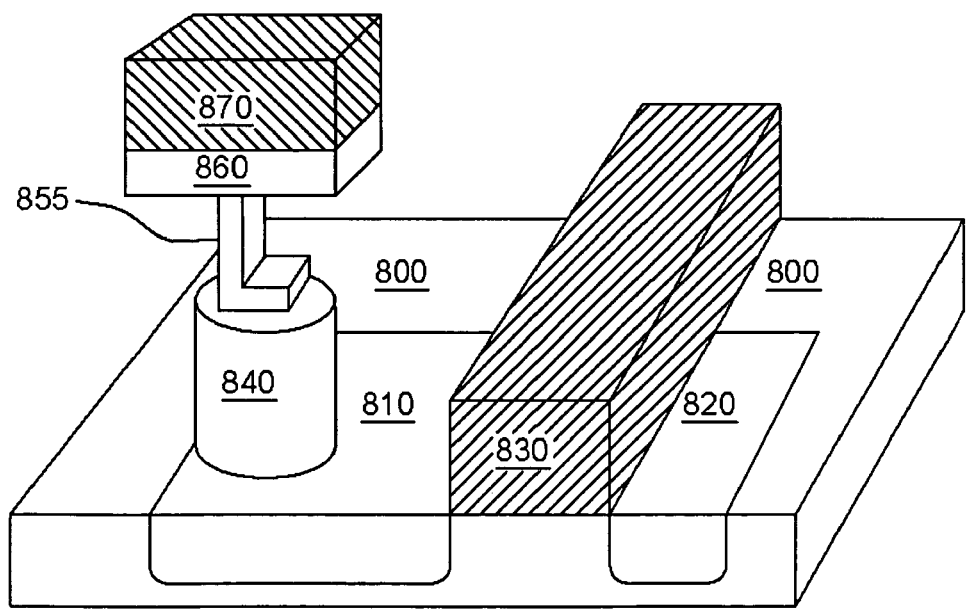
FIG. 25b is a perspective diagram of an embodiment of a conductive L-shaped contact structure memory cell produced by an implementation of the present invention.

Both types of deposited thin film layers establish operative contact with top surfaces of the second layer of doped silicon material 250 or, alternatively, in FIGS. 25*a* and 25*b*, with transistor access devices 810 via contact plugs 840.

Figure 20A:
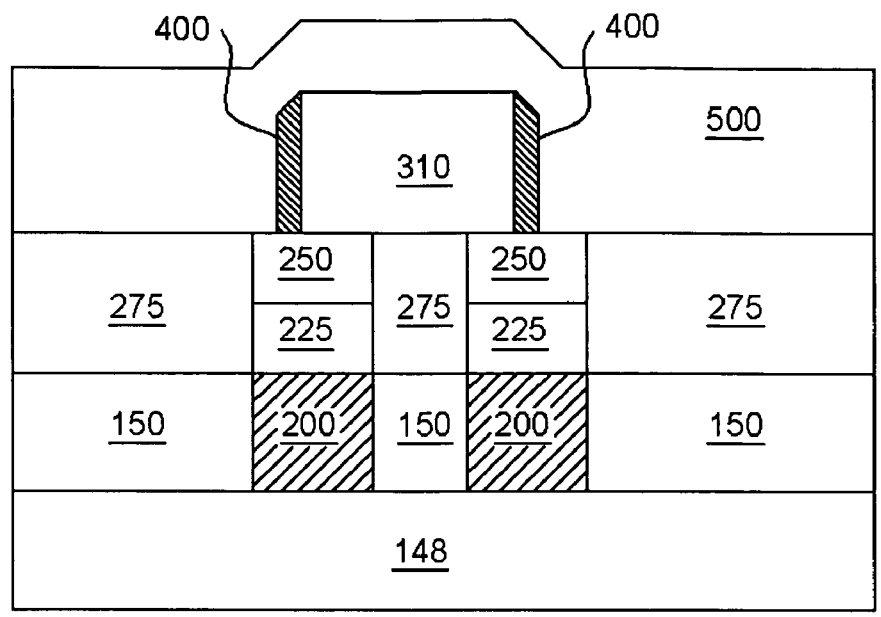
FIG. 20a shows the structure of FIG. 19a following formation of a layer of insulator material over the I-shaped contact structure in accordance with one embodiment of the invention.

FIG. 20*a* shows the structure of FIG. 19*a* after formation of a layer of insulator material 500 over the support structure 310, the I-shaped contact structures 400, the second doped silicon material 250 and the second oxide material 275 (step 60, cf. step 90). The layer of insulator material 500 may comprise, for example, TEOS, SOG, BPSG, or SiO2.

In FIG. 21 the structure of FIG. 20*a* is subjected to a CMP process to planarize the surface down to a level sufficient to expose an upper surface of the support structure 310. In one embodiment, CMP may be stopped when the upper end of the I-shaped or L-shaped contact is first reached (exposed) to provide for a very small contact. However, the contact dimension may not be easy to control as a result of the contact size varying with the CMP loss of tapered-shaped contact structure. In the illustrated embodiment, CMP is performed further until upper ends of the I-shaped contact structures 400 are completely flattened to have planar surfaces substantially parallel with a top surface of the support structure 310 (step 65; cf. step 95). Such a process to CMP the structure of uniform width may provide better dimension control. In modified embodiments, the CMP may be stopped at intermediate positions between the above two described implementations to thereby change the cross-sectional area of the upper end of the I-shaped contact structure 400.

Figure 20B:
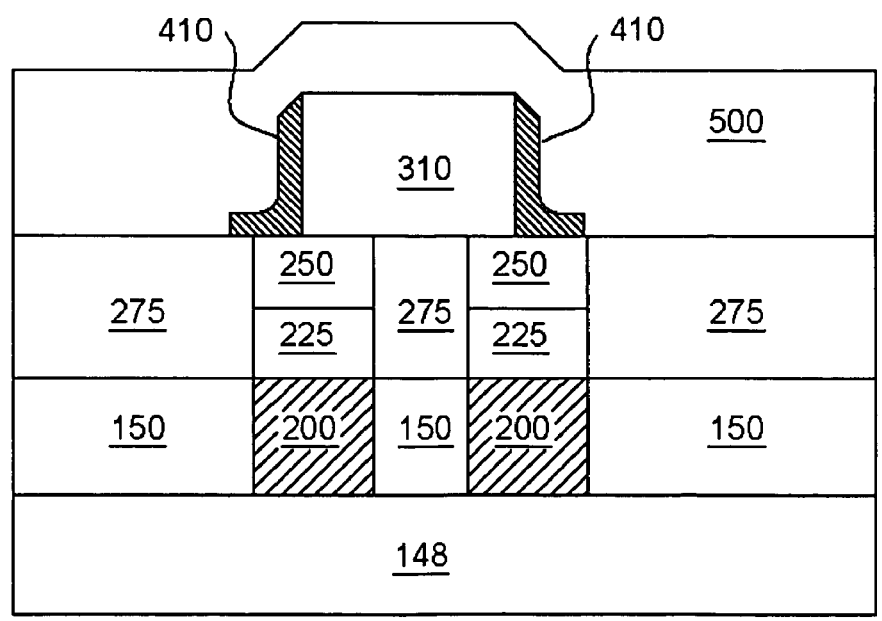
FIG. 20b shows the structure of FIG. 19c after formation of a layer of insulator material over the L-shaped contact structure in accordance with one embodiment of the invention.

FIG. 20*b* shows the structure of FIG. 19*c* after formation of a layer of insulator material 500 over the support structure 310, the L-shaped contact structures 410 and the second oxide material 275. The layer of insulator material 500 may comprise the same material as described in the preceding paragraph, and an ensuing CMP process may comprise the same techniques as set forth in the preceding paragraph to yield the structure of FIG. 21*b*.

Figure 21A:
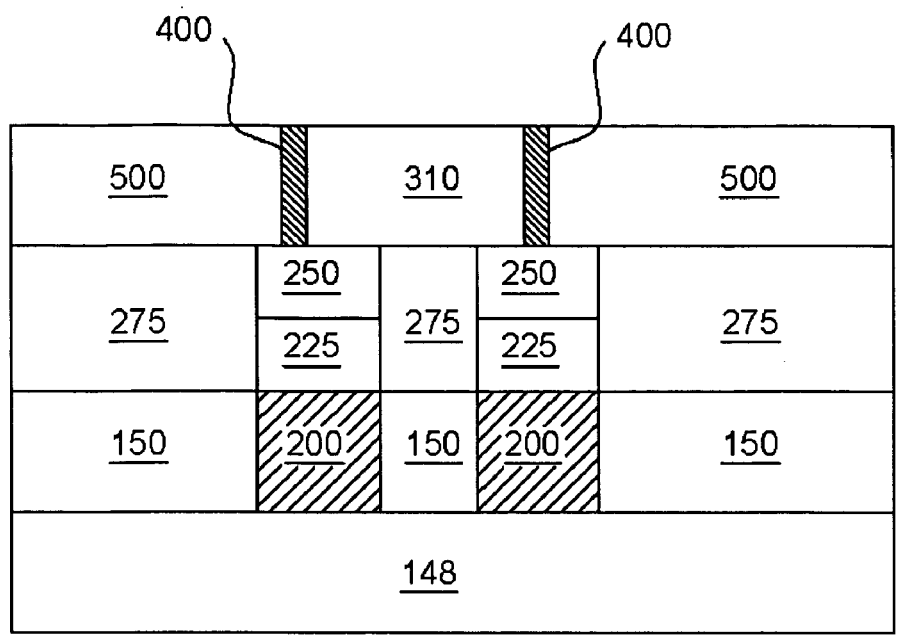
FIG. 21a shows the structure of FIG. 20a after the performance of chemical-mechanical polishing (CMP) to expose a top end surface of an I-shaped contact structure in accordance with one embodiment of the invention.
Figure 21B:
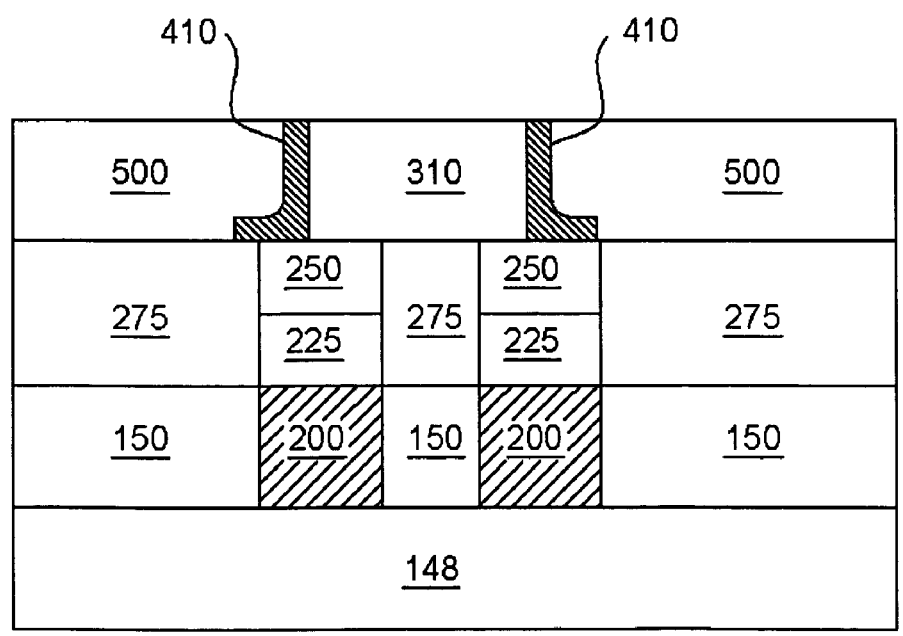
FIG. 21b shows the structure of FIG. 20b after exposing a top end surface of an L-shaped contact structure by CMP in accordance with one embodiment of the invention.
Figure 22A:
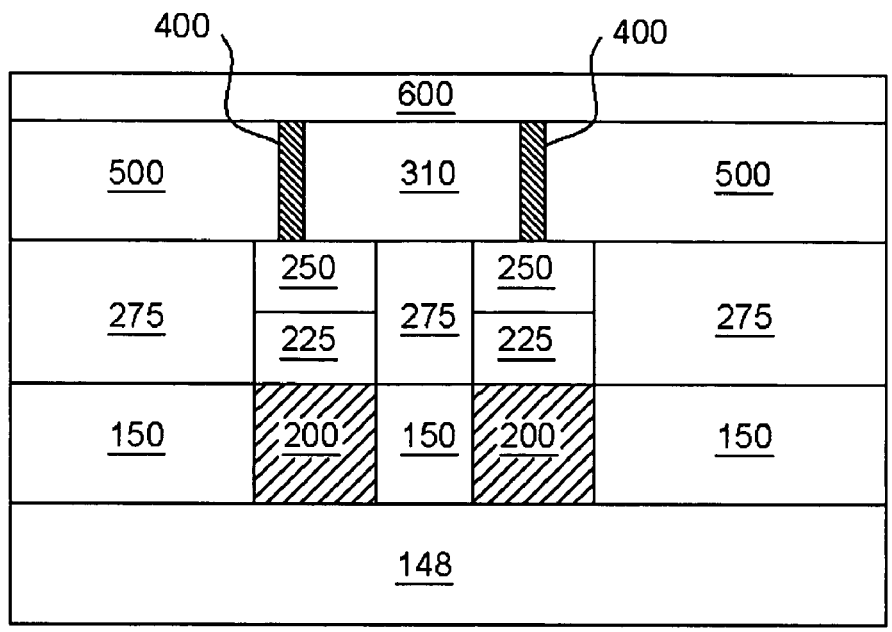
FIG. 22a shows the structure of FIG. 21a in the case of a conductive I-shaped contact structure, after deposition of memory material in accordance with one embodiment of the invention.

FIG. 22*a* shows the structure of FIG. 21*a* after deposition of a memory material 600 over the I-shaped contact structures 400, support structure 310, and insulator material 500 (step 70, cf. step 100). The memory material 600 thus deposited establishes operative contact with top surfaces of the conducting material I-shaped contact structures 400. The area of each contact surface, defined at an interface of an I-shaped contact 400 and the memory material 600, can be controlled, inter alia, by the thickness 450 (FIG. 19*a*) and word line width 750 (FIG. 24, infra) of the I-shaped contact 400. In accordance with an aspect of the present invention, these areas can be made extremely small in comparison to prior-art techniques by implementation of the described methods. According to typical embodiments, the memory material 600 may be formed, for example, of germanium, antimony, and tellurium (e.g. Ge2Sb2Te5) and may be deposited using a sputtering process to thicknesses ranging from about 0.1 nm to about 1000 nm and in an illustrated embodiment about 200 nm.

Figure 22B:
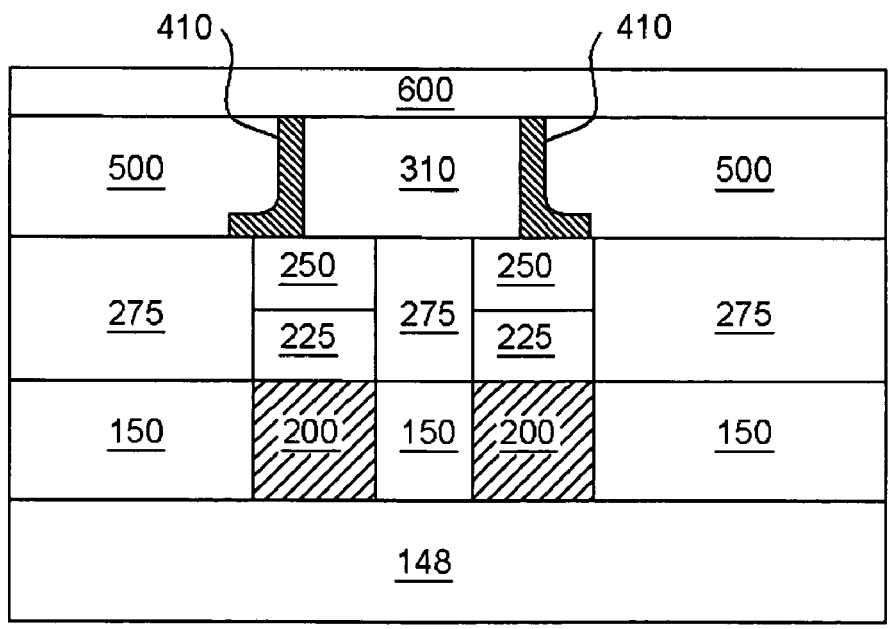
FIG. 22b shows the structure of FIG. 21b in the case of a conductive L-shaped contact structure, after deposition of memory material in accordance with one embodiment of the invention.

A structure similar to that of FIG. 22a, but for an L-shaped contact structure, is shown in FIG. 22b. This figure shows the structure of FIG. 21b after deposition of memory material 600 over exposed surfaces of the L-shaped contact structures 410, support structure 310, and insulator material 500. The layer of memory material 600 may comprise the same material formed in the same ways as described in the preceding paragraph. The memory material 600 thus deposited establishes operative contact with top surfaces of the conducting material L-shaped contact structures 410. As with the I-shaped contact structures, the area of each contact surface, defined at a boundary of an L-shaped contact 410 and the memory material 600, can be determined, inter alia, by controlling the thickness 450 (FIG. 19a) and word line width 750 (FIG. 24, infra) of the L-shaped contact 410.

As distinguished from the memory material embodiments of FIGS. 22a and 22b, wherein memory material 600 is formed over conductive material I-shaped and/or L-shaped contacts, other implementations of the present invention form a conductive material over memory material I-shaped and/or L-shaped contacts (step 100). In such implementations, an insulator material (c.f. 500) is deposited over I-shaped or L-shaped contacts (step 90) followed by any of the CMP processes described above (step 95). The conductive material (cf. 600) formed over the memory material I-shaped or L-shaped contact structures (step 100) may comprise, for example, Ti, W, TiN, TiW, $Ti_xSi_y$, or $Ti_xAl_yN_z$, combinations of these materials, or the like. In typical embodiments, the conductive material may comprise tungsten deposited using a sputtering process to thicknesses ranging from about 10 nm to about 1000 nm and in an illustrated embodiment about 400 nm.

Figure 23A:
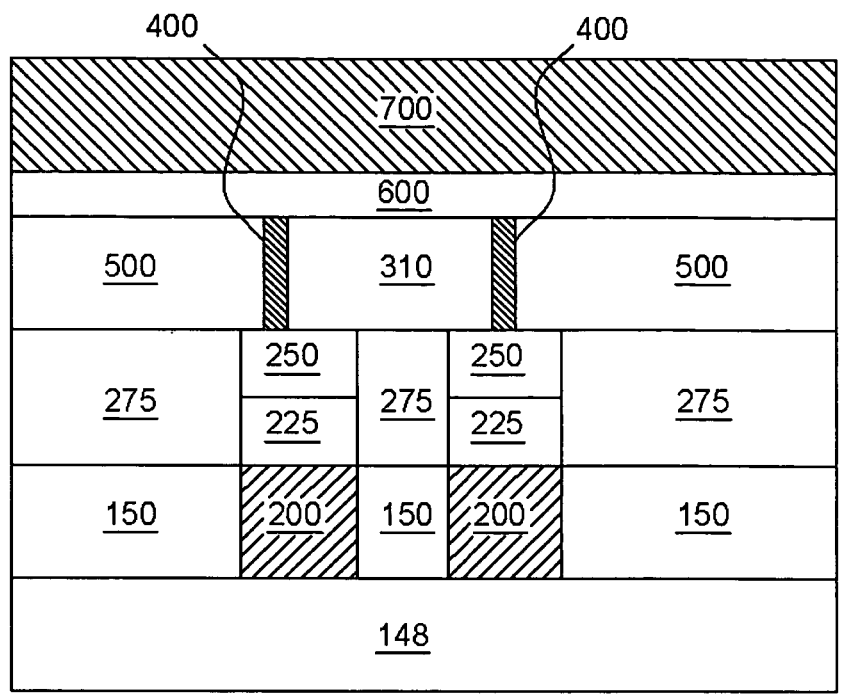
FIG. 23a shows the structure of FIG. 22a after formation of a layer of conducting material in the case of a conductive I-shaped contact structure, in accordance with one embodiment of the invention.
Figure 23B:
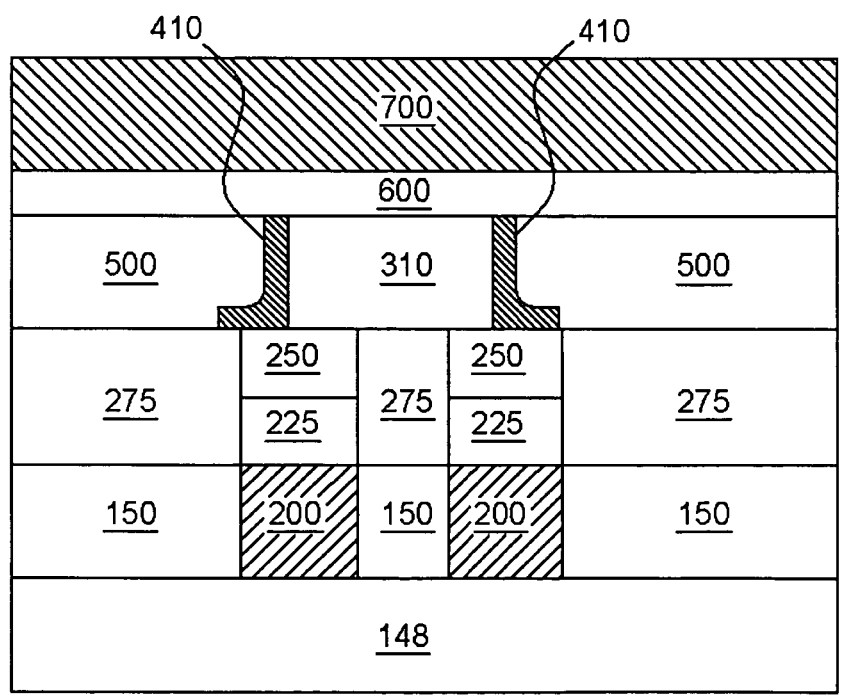
FIG. 23b shows the structure of FIG. 22b after formation of a layer of conducting material in the case of a conductive L-shaped contact structure, in accordance with one embodiment of the invention.

In FIG. 23a the structure of FIG. 22a is modified with the formation of a layer of conducting material 700, which may comprise PL-Si, W, Cu, AlCu, AlCiSu, combinations of these materials, or the like. In typical embodiments, the layer of conducting material 700 may comprise tungsten deposited using a sputtering process to thicknesses ranging from about 10 nm to about 1000 nm. FIG. 23b shows the structure of FIG. 22b, after formation of a layer of conducting material which may be formed as described above.

FIG. 24 shows the structure of FIG. 23a, from a perpendicular cross-sectional view, following an etch (step 105). In other words, the cross-sectional view of FIG. 24 is taken along a line that is perpendicular to the line 12–12' of FIG. 13. A similar appearance to that of FIG. 24 results from application of the etch (step 105) to the structure of FIG. 23b.

With the etches of FIGS. 23a and 23b, the top conducting element or word line is self-aligned with the I-shaped or L-shaped contact structures 400, 410 wherein etching is stopped at upper surfaces of the bottom conducting elements 200 to form word lines and memory cells. In modified embodiments wherein access devices are not used, etching may be continued through the I-shaped or L-shaped contact structures 400, 410, or may be continued further down through the bottom conducting elements.

According to typical embodiments, the width 750 of the top conducting element 700 can range from about 10 nm to about 1 µm and, in an exemplary embodiment, can be about 200 nm. The word line width 750 determines the second dimension of the active area of the I-shaped and L-shaped contact structures 400, 410. In such embodiments, the contact structure active area is thus defined by the product of the word line width 750 and the contact structure thickness 450. It will be understood by those skilled in the art that the methods described herein for controlling the thickness 450 and width 750 of the top surface active area can facilitate the provision of I-shaped and L-shaped contact structures having relatively small cross-sectional areas. For example, if the thickness 450 of the thin film layer is about 25 nm and the width 750 of the top conductor is about 100 nm, then the resulting cross-sectional active area of each of the I-shaped and L-shaped contact structures may be about 2500 $nm^2$. This area corresponds to a circular contact-structure diameter of about 100 nm or a square contact-structure width of about 100 nm. The methods of the present invention therefore may result in contact areas that are considerably smaller than those achievable by many methods of the prior art and, accordingly, fewer photolithography limitations may be presented.

FIGS. 25a and 25b illustrate alternative embodiments implementing transistors, rather than diodes, as access devices. In particular, the perspective diagram of FIG. 25a shows an embodiment of an I-shaped contact structure including a transistor as an access device or steering element. The components of the memory cell comprise a top conducting element or word line 870, a memory material 860, an I-shaped contact structure 850, a contact plug 840, a bottom conducting element or bit line 830, a doped silicon region 820, a doped silicon region 810, and a substrate 800. Similarly, FIG. 25b is a perspective diagram of an L-shaped contact structure including a transistor as an access device or steering element. The components of the memory cell comprise a top conducting element or word line 870, a memory material 860, an L-shaped contact structure 855, a contact plug 840, a bottom conducting element or bit line 830, a doped silicon region 820, a doped silicon region 810, and a substrate 800.

In view of the foregoing, it will be understood by those skilled in the art that the methods of the present invention can facilitate formation of semiconductor devices generally, read only memory devices, and, in particular, read only memory devices employing phase change materials in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A memory element, comprising:
   a bottom conducting element disposed over a substrate;
   an I-shaped contact structure formed by a deposition thin film process on a sidewall of a support structure and operatively coupled with the bottom conducting element, the I-shaped contact structure having a minimum cross-sectional dimension less than about 1 micron determined by the deposition thin film process and having a top surface;
   a top conducting element disposed over and operatively coupled to the I-shaped contact structure: and
   a phase-change memory material disposed between the contact structure and the top conducting element.

2. The memory element as set forth in claim 1, wherein the I-shaped contact structure comprises a foot portion, thus defining an L-shaped contact structure.

3. The memory element as set forth in claim 1, wherein:
the memory element further comprises an access device operatively coupled between the bottom conducting element and the I-shaped contact structure;
the bottom conducting element forms a bit line for the memory element; and
the top conducting element forms a word line for the memory element.

4. The memory element as set forth in any one of claims 1–3, wherein:
the I-shaped contact structure comprises a conductive material; and
the phase-change memory material layer is at least partially disposed over and operatively coupled to the top surface of the I-shaped contact structure.

5. The memory element as set forth in claim 4, wherein the memory material layer comprises chalcogenide.

6. The memory element as set forth in any one of claims 1–3, wherein the contact structure comprises a memory material.

7. The memory element as set forth in claim 6, wherein the memory material comprises chalcogenide.

8. An array of memory cells organized into rows along bit lines and columns along word lines with memory cells disposed at intersections of the rows and the columns, each of a plurality of the memory cells comprising:
a bottom conducting element disposed on a substrate, wherein the bottom conducting element forms a common bit line for the memory array;
an access device formed over and operatively coupled with the bottom conducting element;
a contact structure formed by a deposition thin film process on a sidewall of a support structure and comprising an I shape with a minimum cross-sectional dimension less than about 1 micron determined by the deposition thin film process and being at least partially formed over and operatively coupled with the access device, the I-shaped contact structure having a top surface;
a top conducting element at least partially disposed over and operatively coupled to the top surface of the I-shaped contact structure, wherein the top conducting element forms a common word line for the memory array; and
a phase-change memory material disposed between the contact structure and the top conducting element.

9. An array of memory cells organized into rows along bit lines and columns along word lines with memory cells at intersection of the rows and the columns, each of a plurality of memory cells comprising:
a bottom conducting element disposed on a substrate, wherein the bottom conducting element forms a common bit line for the memory array;
an access device formed over and operatively coupled with the bottom conducting element;
a contact structure formed by a deposition thin film process on a sidewall of a support structure and comprising an L shape with a minimum cross-sectional dimension less than about 1 micron determined by the deposition thin film process and being at least partially formed over and operatively coupled with the access device, the L-shaped contact structure having a top surface;
a top conducting element at least partially disposed over and operatively coupled to the top surface of the L-shaped contact structure, wherein the top conducting element forms a common word line for the memory array; and
a phase-change memory material disposed between the contact structure and the top conducting element.

10. The array of memory cells as set forth in claim 8 or 9, wherein the phase-change memory material comprises chalcogenide.

11. The array of memory cells as set forth in claim 8 or 9, wherein the contact structure comprises a conductive material.

12. The array of memory cells as set forth in claim 11, wherein the memory material comprises chalcogenide.

13. The memory element as set forth in claim 1, wherein the minimum cross-sectional dimension is about 200 nanometers.

14. The memory element as set forth in claim 1, wherein the minimum cross-sectional dimension is about 100 nanometers.

15. The array of memory cells as set forth in claim 8, wherein the minimum cross-sectional dimension is about 200 nanometers.

16. The array of memory cells as set forth in claim 8, wherein the minimum cross-sectional dimension is about 100 nanometers.

17. The array of memory cells as set forth in claim 8, wherein the minimum cross-sectional dimension is about 200 nanometers.

18. The array of memory cells as set forth in claim 8, wherein the minimum cross-sectional dimension is about 100 nanometers.

* * * * *